United States Patent
Saito et al.

(10) Patent No.: US 7,648,813 B2
(45) Date of Patent: Jan. 19, 2010

(54) PATTERN FORMING METHOD

(75) Inventors: Mitsunaga Saito, Inzai (JP); Yasushi Shinjiyo, Kawasaki (JP); Yoshihiro Tajima, Tano-gun (JP); Koichi Ishii, Kawasaki (JP); Masahiro Hosoya, Okegawa (JP); Ken Takahashi, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/268,699

(22) Filed: Nov. 11, 2008

(65) Prior Publication Data

US 2009/0123855 A1 May 14, 2009

Related U.S. Application Data

(63) Continuation of application No. PCT/JP2007/059522, filed on May 8, 2007.

(30) Foreign Application Priority Data

May 12, 2006 (JP) .............................. 2006-134022

(51) Int. Cl.
*G03G 13/045* (2006.01)

(52) U.S. Cl. ............ 430/125.1; 430/125.3; 430/125.31; 430/125.5; 399/310

(58) Field of Classification Search .............. 430/125.1, 430/125.3, 125.31, 125.5; 399/310
See application file for complete search history.

(56) References Cited

U.S. PATENT DOCUMENTS

| 4,860,417 A * | 8/1989 | Tajima et al. ................... 492/8 |
| 6,233,422 B1 * | 5/2001 | Abe et al. .................... 399/303 |
| 2005/0276211 A1 * | 12/2005 | Hirotsune et al. ......... 369/272.1 |
| 2006/0220050 A1 * | 10/2006 | Higaki et al. ................. 257/99 |
| 2007/0139299 A1 * | 6/2007 | Huang et al. ................. 345/3.1 |
| 2008/0248413 A1 | 10/2008 | Ishii et al. |

FOREIGN PATENT DOCUMENTS

| JP | 06-265712 | 9/1994 |
| JP | 07-006692 | 1/1995 |
| JP | 10-324994 | 12/1998 |
| JP | 2002-527783 | 8/2002 |
| JP | 2004-030980 | 1/2004 |

* cited by examiner

*Primary Examiner*—Hoa V Le
(74) *Attorney, Agent, or Firm*—Oblon, Spivak, McClelland, Maier & Neustadt, L.L.P.

(57) ABSTRACT

By using an intaglio plate for holding a pattern formed by a developing agent, a transfer device for transferring patterns developed on the intaglio plate to a transfer object medium, and a baking chamber for eliminating an electrode layer after transfer or heightening resistance thereof, the patterns developed on the intaglio plate are transferred onto the electrode layer disposed at the opposite side of the transfer object medium, and then heated in the baking chamber, whereby the electrode layer is eliminated or heightened in resistance.

4 Claims, 8 Drawing Sheets

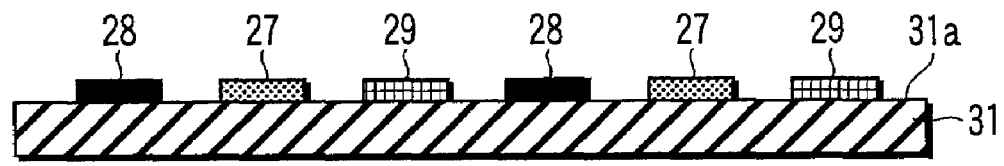
F I G. 12
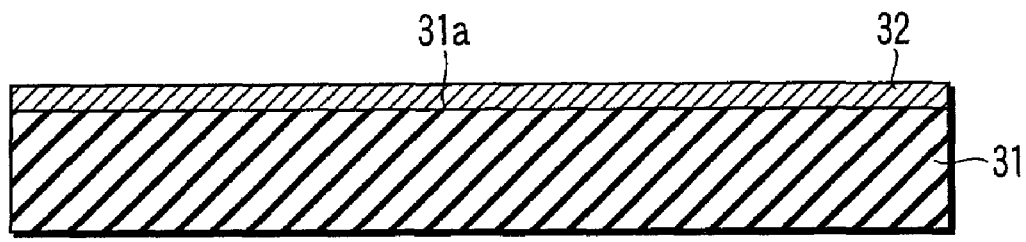
F I G. 13
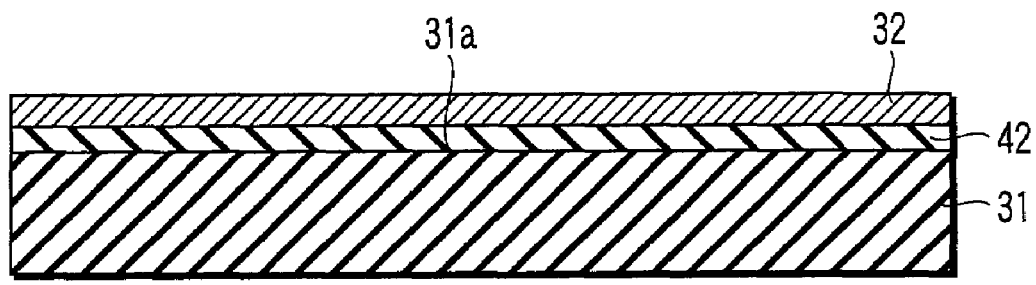
F I G. 14

PATTERN FORMING METHOD

CROSS REFERENCE TO RELATED APPLICATIONS

This is a Continuation Application of PCT Application No. PCT/JP2007/059522, filed May 8, 2007, which was published under PCT Article 21(2) in Japanese.

This application is based upon and claims the benefit of priority from prior Japanese Patent Application No. 2006-134022, filed May 12, 2006, the entire contents of which are incorporated herein by reference.

BACKGROUND OF THE INVENTION

1. Field of the Invention

The present invention relates to a pattern forming method for forming a pattern on an insulating board by using a functional material in the manufacturing process of, for example, flat panel image display device, wiring board, or IC tag.

2. Description of the Related Art

Conventionally, the technology of photolithography has been playing a principal role as the technique for forming a fine pattern on the surface of a board material. This technology of photolithography has been enhancing the resolution and performance, while a tremendous investment is needed in the manufacturing equipment, and the manufacturing cost is soaring along with enhancement of resolution.

On the other hand, in the manufacturing field of semiconductor devices, image display devices and others, the demand for lower price is mounting along with the request for improvement of performance, and such request can be no longer satisfied by the existing technology of photolithography. In this background, a recent attention is being focused on the pattern forming technology making use of digital printing technique.

By contrast, for example, the ink jet technology comes to be realized as patterning technology simple in apparatus and characterized by non-contact patterning, but it is limited indeed in enhancement of resolution and productivity. In this respect, the technology of electrophotography, especially electrophotography using liquid toner is excellent in possibility.

By utilizing this technology of electrophotography, various methods have been proposed for forming phosphor layer, black matrix or color filter on the front board for flat panel display (see, for example, Jpn. Pat. Appln. KOKAI Publication Nos. 2004-30980 and 6-265712).

However, in the field of flat panel display, the demand for higher resolution is escalating, and it is requested to form a pattern of higher resolution at higher precision of position. Actually, however, it is hard to meet the needs by the method of electrophotography. This is because the resolution of the writing optical system is about 1200 dpi at most, which is insufficient for resolution or positioning. Also, it is not possible to realize a broad writing optical system applicable to the recent wide screen of display.

On the other hand, it has been proposed to form a pattern of phosphor or the like on a front glass for display, by using an electrostatic printing plate having patterns different in electric resistance preliminarily formed on the surface, instead of the phosphor, developing the patterns by applying a liquid toner on the plate, and transferring the pattern images to the glass plate (see, for example, Jpn. PCT National Publication No. 2002-527783).

However, as a result of intensive studies and experiments by the present inventors, the following intrinsic problems have been discovered also in this method.

First, the developed image by liquid toner is generally about 1 μm or less in film thickness, and it is not suited to forming of a thick film such as phosphor or color filter of the display device, and thus a new idea is needed for forming a thick film of high definition.

Besides, if a corona charger is used when transferring the developed image on the glass plate, the corona charge may leak through the glass surface, and the transfer characteristics tend to be unstable. In addition, the spatial charge is likely to be accumulated inside the glass, and thus it has been difficult to form a transfer electric field capable of overcoming this spatial charge by the corona discharge. Further, when the developed image of one color is transferred, this problem becomes more obvious, and it has been very difficult to transfer the developed images of the second color and third color on the glass plate.

BRIEF SUMMARY OF THE INVENTION

It is hence an object of the invention to provide a pattern forming method capable of transferring a developing agent efficiently on an insulating board.

In order to achieve the above-described object, a pattern forming method of the present invention comprises: a developing step of forming a pattern image by a charged developing agent on an image carrier; a transfer step of disposing a transfer object medium having an electrode layer on the opposite side facing the image carrier oppositely to the image carrier, forming an electric field between the image carrier and the electrode layer, and transferring the pattern image on the transfer object medium; and an eliminating step of eliminating the electrode layer.

According to the invention, an electrode layer is provided at a side closer to an image carrier of a transfer object medium, an electric field is formed between this electrode layer and the image carrier, and the electrode layer is eliminated after the pattern image formed on the image carrier is transferred. Thus, since the electrode layer is very close to the image carrier, a relatively strong transfer electric field is formed, and the transfer efficiency of pattern image on the transfer object medium can be enhanced. Moreover, since the electrode layer used in transfer is later eliminated, various problems caused by the presence of the electrode layer can be prevented.

Also, a pattern forming method of the present invention comprises: a developing step of forming a pattern image by a charged developing agent on an image carrier; a transfer step of disposing a transfer object medium having an electrode layer on the opposite side facing the image carrier oppositely to the image carrier, forming an electric field between the image carrier and the electrode layer, and transferring the pattern image on the transfer object medium; and a resistance heightening step of heightening resistance by heating the electrode layer.

Moreover, a pattern forming method of the present invention comprises: an electrode layer forming step of forming a patterned electrode layer on a surface side of an insulating board; a developing step of supplying a charged developing agent to the insulating board through a supply member disposed oppositely to the surface side of the insulating board, forming an electric field between the supply member and the electrode layer, and forming a pattern image by collecting the developing agent on the electrode layer; and an eliminating step of eliminating the electrode layer.

Furthermore, a pattern forming method of the present invention comprises: an electrode layer forming step of forming a patterned electrode layer on a surface side of an insulating board; a developing step of supplying a charged developing agent to the insulating board through a supply member disposed oppositely to the surface side of the insulating board, forming an electric field between the supply member and the electrode layer, and forming a pattern image by collecting the developing agent on the electrode layer; and a resistance heightening step of heightening resistance by heating the electrode layer.

BRIEF DESCRIPTION OF THE SEVERAL VIEWS OF THE DRAWING

FIG. 12 is a diagram showing the transfer object medium after the baking process in FIG. 11.

FIG. 13 is a diagram for explaining Example 1.
FIG. 14 is a diagram for explaining Example 2.

DETAILED DESCRIPTION OF THE INVENTION

Figure 1:
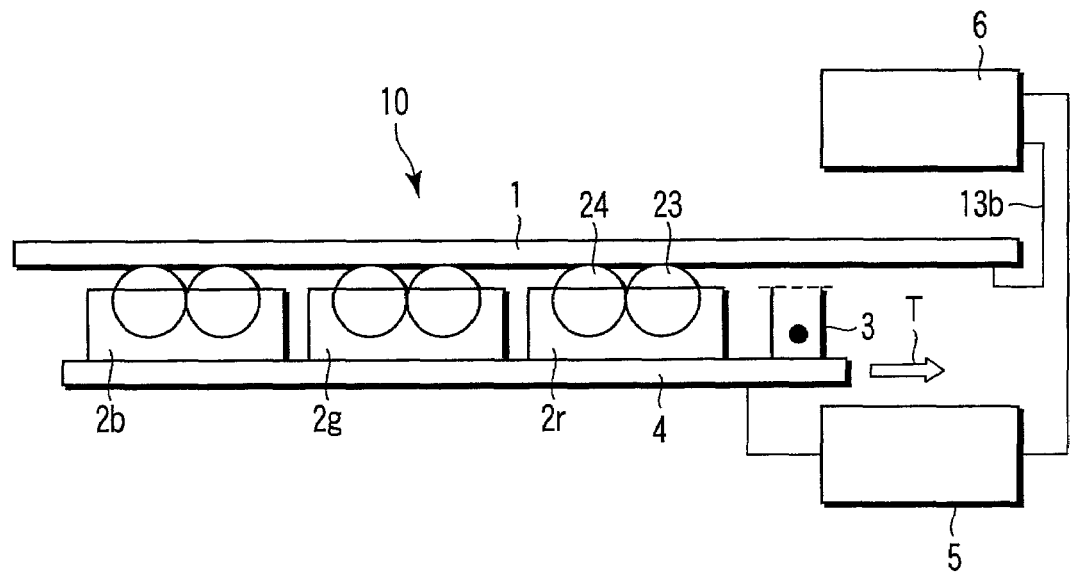
FIG. 1 is a schematic diagram of an essential configuration of a pattern forming device according to an embodiment of the invention.

Referring now to the drawings, embodiments of the invention will be specifically described below.

FIG. 1 schematically shows essential parts of a pattern forming device 10 according to an embodiment of the invention. This pattern forming device 10 is a device for forming a phosphor layer or a color filter on the inner side of a display panel of, for example, a flat panel type image display device.

The pattern forming device 10 includes a flat intaglio plate 1 functioning as an image carrier of the invention, a plurality of developing devices 2r, 2g, 2b (or collectively called developing devices 2) for developing by supplying liquid developing agents of individual colors (r: red, g: green, b: blue) to the intaglio plate 1, a charging device 3 for charging a surface 14a of a high resistance layer 14 described below of the intaglio plate 1 at a predetermined potential, and a stage 4 holding the plurality of developing devices 2 and charging device 3.

The pattern forming device 10 also includes a control device 5 for moving the stage 4 relatively in a direction of arrow T in the diagram to the intaglio plate 1, while keeping a gap between each developing device 2 and the intaglio plate 1, and a power source device 6 for applying a voltage to a pattern electrode 13 mentioned below of the intaglio plate 1 on the basis of the control signal output from this control device 5. In addition, the pattern forming device 10 also includes a transfer device 30 and a baking chamber 40 (not shown) in FIG. 1 as described below.

Figure 2:
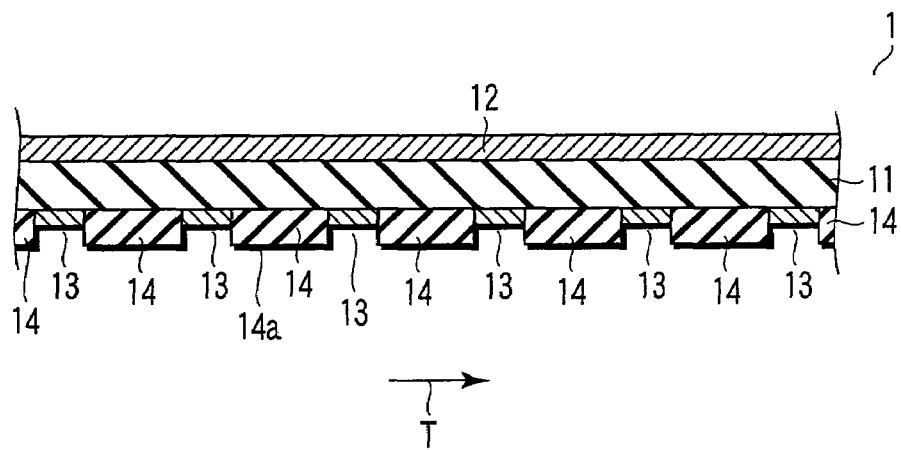
FIG. 2 is a partially magnified sectional view of an intaglio plate used in the pattern forming device in FIG. 1.

FIG. 2 is a partial sectional view of the intaglio plate 1. The intaglio plate 1 includes an insulating board 11, a common electrode 12 formed at the reverse side of the board 11 remote from the developing device 2, a plurality of pattern electrodes 13 provided on the surface side of the board 11, and a high resistance layer 14 for partially covering and dividing the plurality of pattern electrodes 13, and forming recesses 14b in pixel units described below.

The board 11 is formed of, for example, polyimide, PET (polyethylene terephthalate), PEN (polyethylene naphthalate), or other resin material or glass material, and has a thickness of about 20 μm to 200 μm. The common electrode 12 is formed of, for example, a conductive material such as aluminum or stainless steel, and has a thickness of about 100 μm to 3000 μm. The high resistance layer 14 is formed of, for example, resins such as polyimide, acrylic, polyester, urethane, epoxy, Teflon (registered trademark), nylon or phenol, or ceramics with volume resistivity of $10^{10}$ Ωcm or more (including insulators) and has a thickness of 10 μm to 30 μm, preferably 20 μm±2 μm.

Figure 4:
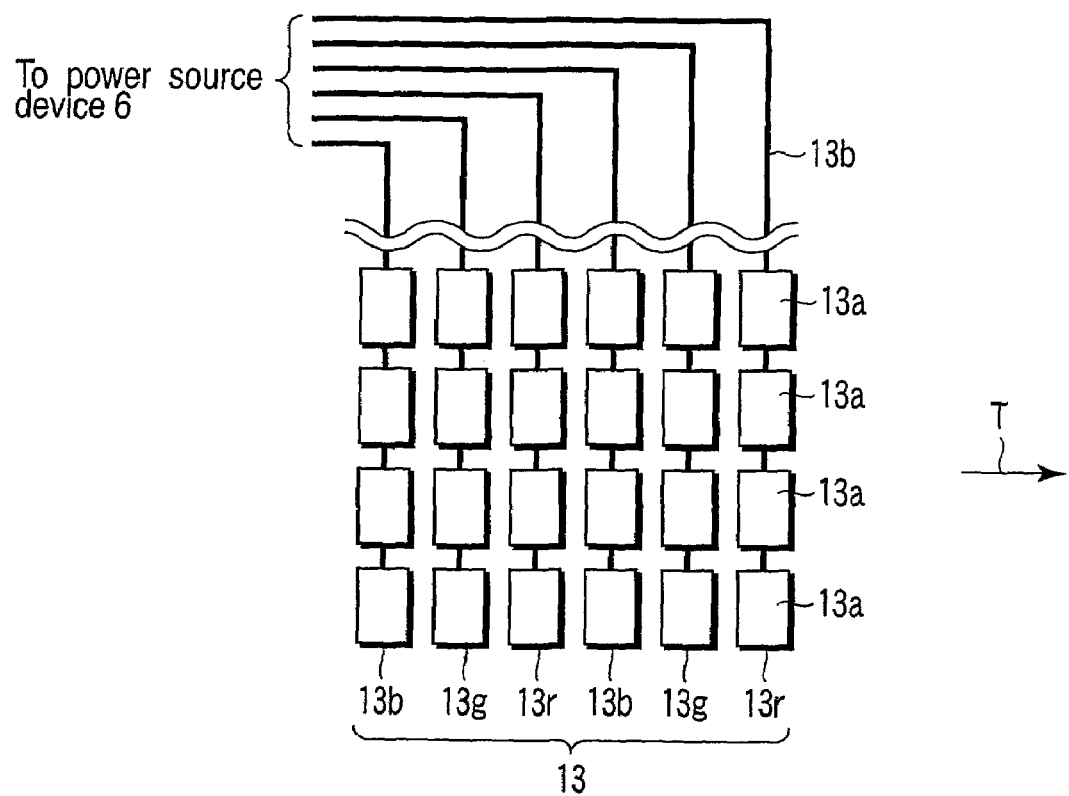
FIG. 4 is a schematic diagram partially showing a plurality of pattern electrodes provided in the intaglio plate in FIG. 2.

The pattern electrode 13 has a pattern formed on the surface of the board 11 as shown in FIG. 4. The pattern electrode 13 of the embodiment has a plurality of the same patterns arranged in a relative moving direction T of the stage 4 to the intaglio plate 1, and the pattern electrodes 13 are patterned mutually in parallel electrically and independently. Each pattern electrode 13 has a plurality of rectangular portions 13a corresponding to one pixel of the display panel connected with a slender wiring portion 13b. In the case of the intaglio plate 1 used in a device for forming a phosphor layer or a color filter of a display panel as in the embodiment, the plurality of pattern electrodes 13 are assigned as pattern electrode for red color 13r, pattern electrode for green color 13g, and pattern electrode for blue color 13b, which are alternately arrayed and formed in this sequence.

Figure 3:
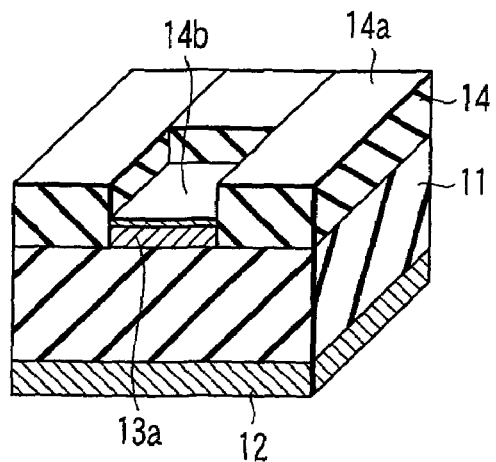
FIG. 3 is partially magnified perspective view explaining the structure of one recess of the intaglio plate in FIG. 2.

The high resistance layer 14 has a plurality of recesses 14b for exposing all the rectangular portions 13a of each pattern electrode 13. In other words, the high resistance layer 14 has a shape of partially covering the wiring portion 13b of the plurality of pattern electrodes 13 patterned on the surface of the board 11, and exposing only the rectangular portions 13a to the surface side. FIG. 3 shows the recesses 14b of the high resistance layer 14 exposing the rectangular portions 13a of the pattern electrode 13 in a partially magnified sectional view. The depth of the recesses 14b nearly corresponds to the film thickness of the high resistance layer 14.

Figure 5:
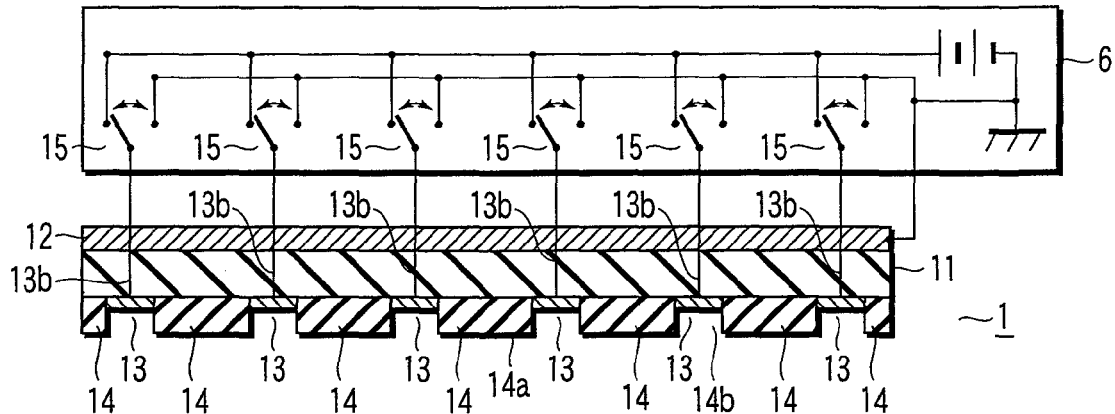
FIG. 5 is a diagram explaining the structure of a power source device for controlling changeover of voltage applied to the pattern electrodes in FIG. 4.

Each pattern electrode 13 is connected to the power source device 6 as shown in FIG. 5, and a different voltage is independently applied to each pattern electrode 13. In this embodiment, a switch 15 is wired individually to each pattern electrode 13, and each pattern electrode 13 can be changed over independently either to the supply voltage (+200V in this embodiment) or the grounding voltage (0V). In this power source device 6, the common electrode 12 is connected to the grounding potential (0V). Instead of changing over the voltage to be applied to each pattern electrode 13 between two levels, a variable resistor function may be provided so as to apply a desired voltage independently to each pattern electrode 13.

Figure 6:
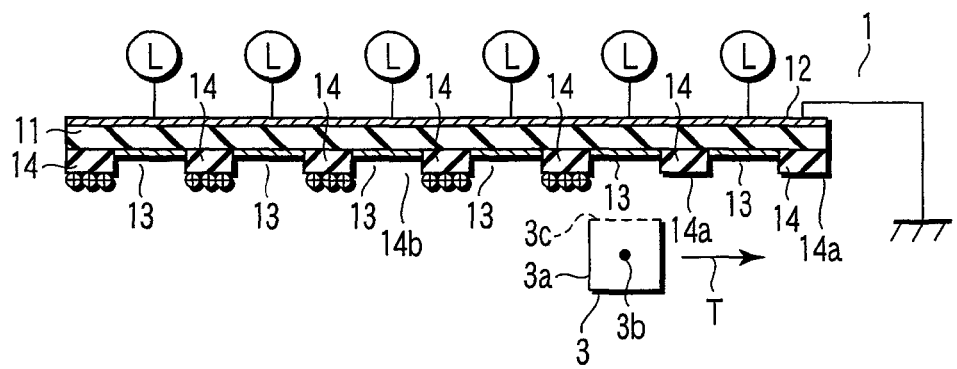
FIG. 6 is an operation explanatory diagram for explaining the charging process on the intaglio plate in FIG. 2.

The charging device 3 in this embodiment is a Scorotron charger having a charging case 3a, a charging wire 3b, and a grid electrode 3c as shown in FIG. 6. The charging device 3 may be also realized by a Corotron charger not having a grid electrode, or an ion generator not using wire. Anyway, the charging device 3 is disposed oppositely to the surface 14a of the high resistance layer 14 of the intaglio plate 1 across a gap of about 1 mm to 2 mm, and is moved in a direction of crossing the pattern electrodes 13 (arrow T direction) by the movement of the stage 4.

Figure 7:
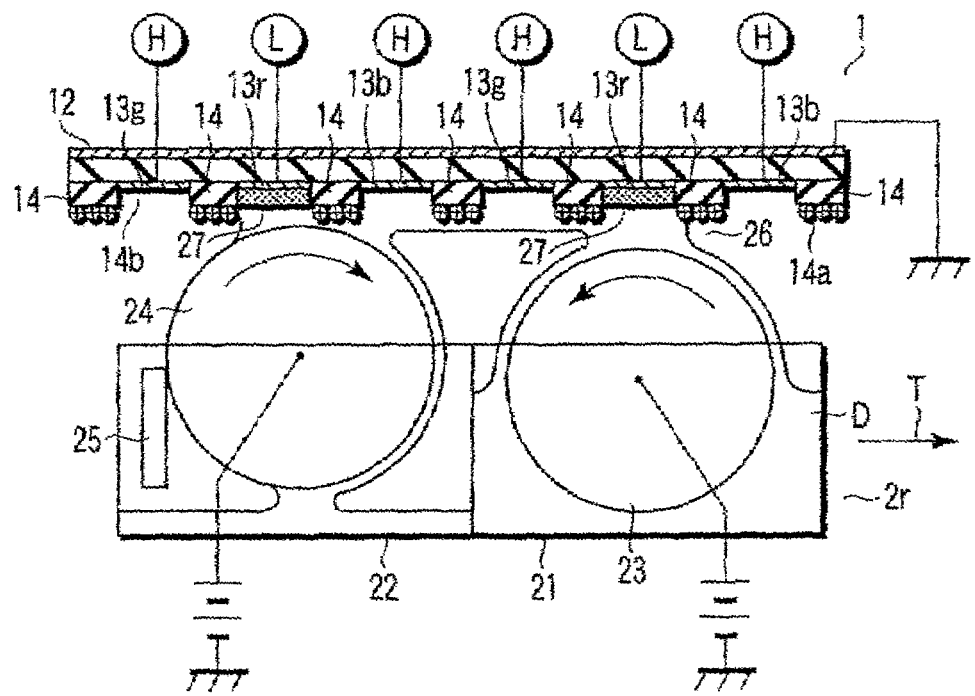
FIG. 7 is an operation explanatory diagram for explaining the developing process of a first color on the intaglio plate in FIG. 2.
Figure 8:
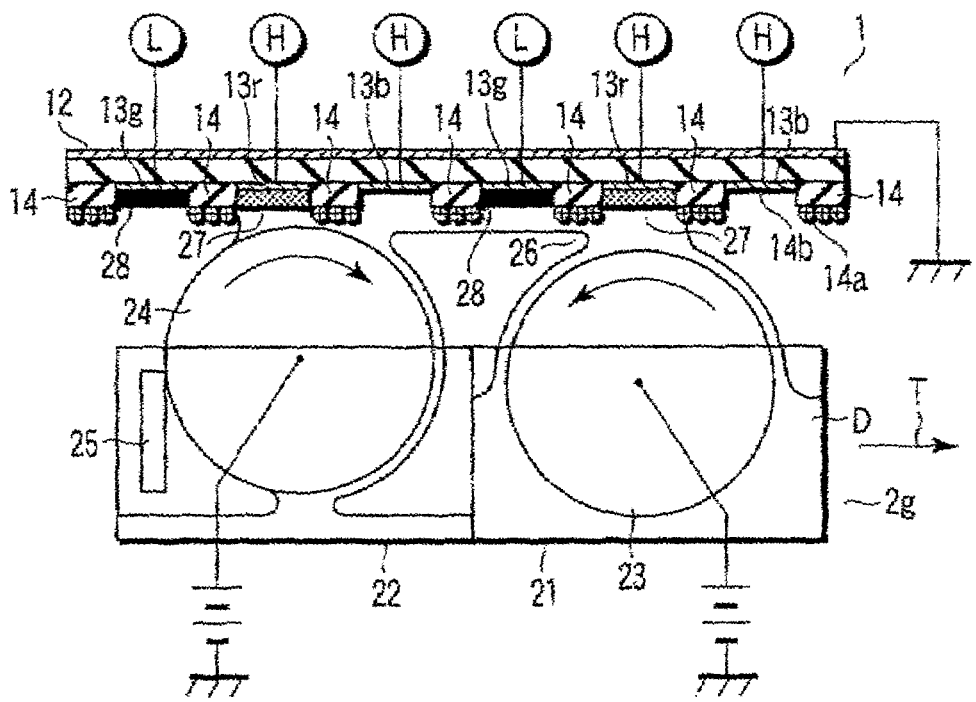
FIG. 8 is an operation explanatory diagram for explaining the developing process of a second color on the intaglio plate in FIG. 2.

FIGS. 7 and 8 are magnified views of an outline structure of the developing device 2. The developing devices for individual colors 2r, 2g, 2b are identical in structure except that the liquid developing agents used are different, and are represented by the developing device 2 in the following explanation.

The developing device 2 has two casings 21, 22 disposed in parallel along the moving direction T to the intaglio plate 1. A developing roller 23 is provided in the downstream side casing 21 in the moving direction. The developing roller 23 is disposed oppositely to the surface 14a of the high resistance layer 14 of the intaglio plate 1 across a gap of about 100 μm to 500 μm so that the peripheral surface of the roller may be at the opposite position, and is rotated in the counterclockwise direction in the drawing.

A squeeze roller 24 is provided in the upstream side casing 22 in the moving direction. The squeeze roller 24 is disposed so that its peripheral surface may be more closely opposite to the intaglio plate 1 than the developing roller 23, that is, at a position remote from the surface 14a of the high resistance layer 14 by about 30 μm to 100 μm, and is rotated in the clockwise direction in the drawing. The squeeze roller 24 partially scrapes off the liquid developing agent supplied on the intaglio plate 1 from the developing roller 23, and controls the film thickness of the liquid developing agent remaining on the intaglio plate 1. A cleaning blade 25 formed of a rubber piece is disposed in contact with the peripheral surface of the squeeze roller 24.

The liquid developing agent D is contained in a developing agent tank (not shown), and is supplied into the casing 21 through a nozzle (not shown) by a pump (not shown). The liquid developing agent D in the casing 21 is supplied to the intaglio plate 1 through the developing roller 23. Of the liquid developing agent supplied to the intaglio plate 1, an excess liquid developing agent is collected in the casing 22 through the squeeze roller 24 and cleaning blade 25, and is discharged into a collection tank (not shown) through a nozzle (not shown) by a pump (not shown). The liquid developing agent D is composed of color phosphor particles charged in an insulating liquid, in which coloring matter particles (developing agent particles) such as pigment or dye are dispersed. The color developing agent particles contain metal soap or the like to be charged positively.

The developing devices 2r, 2g, 2b and the charging device 3 held by the stage 4 are moved in the arrow T direction along the surface of the intaglio plate 1 as the stage 4 is moved in the arrow T direction to the intaglio plate 1 under the control of the control device 5. At this time, the stage 4 is moved nearly in parallel to the surface of the intaglio plate 1 so as to maintain the specified gap between the intaglio plate 1 and the developing device 2, and the gap between the intaglio plate 1 and the charging device 3.

The pattern forming method by this pattern forming device 10 will be explained by referring to FIGS. 6 to 12.

As shown in FIG. 6, the control device 5 moves the stage 4 (not shown herein) at a constant speed, the charging device 3 is moved at a constant speed relatively in the arrow direction T to the intaglio plate 1, and the surface 14a of the high resistance layer 14 of the intaglio plate 1 is charged. The switch 15 of the power source device 6 is changed over so that the common electrode 12 and all the pattern electrodes 13 of the intaglio plate 1 may be uniform at the grounding potential (0V).

As a result, by charging, the electric charge applied to the pattern electrode 13 flows to the grounding potential, and only the surface 14a of the high resistance layer 14 is charged as shown in the drawing. In the embodiment, a direct-current voltage of about +6 kV is applied to the charging wire 3b, and a direct-current voltage of about +350V is applied to the charging case 3a and the grid electrode 3c, whereby the surface 14a of the high resistance layer 14 of the intaglio plate 1 is charged at, for example, +400V.

At this time, the developing devices 2r, 2g, 2b held by the stage 4 are also moved together in the arrow T direction, and in parallel to the charging operation of the intaglio plate 1, the individual color liquid developing agents are supplied to the intaglio plate 1 to develop the corresponding color pattern electrodes 13. In other words, the color images are sequentially developed on the positions of the intaglio plate 1 charge by the charging device 3.

FIG. 7 is an operation explanatory diagram for explaining the developing operation of a first color (red color) executed in parallel to the charging operation. When the red liquid developing agent is supplied and developed in the red pattern electrode 13r, of the plurality of pattern electrodes 13 (see FIG. 4) of the intaglio plate 1, the pattern electrode 13r corresponding to red pixel is changed over to the grounding potential (0V) (L level), while the other color pattern electrodes 13g, 13b are changed over to the power source potential (+200V in this embodiment) (H level). Specifically, when forming three color phosphor layers of the display panel, red, green and blue pixels are arranged and formed alternately, and thus, as shown in FIG. 7, a voltage of L level is applied to every two pattern electrodes 13 out of the plurality of pattern electrodes 13.

In this state, the developing roller 23 of the developing device 2r is rotated in the counterclockwise direction in the drawing, and the red liquid developing agent D contained in the casing 21 is adhered to the roller peripheral surface and is taken up. At this time, the developing roller 23 is rotated so that its peripheral speed may be about 2 to 5 times of the moving speed of the developing device 2r by the stage 4. The liquid developing agent D taken up by the roller peripheral surface leaks and spreads to the opposite intaglio plate 1 across a specific gap, and a nip 26 filled with the liquid developing agent D is formed therebetween.

When a direct-current bias voltage of about +200V is applied to the developing roller 23, for example, in the nip 26, an electric field is formed from the developing roller 23 to the red pattern electrode 13r, an electric field is formed from the surface 14a of the high resistance layer 14 charged at +400V to the developing roller 23, and an electric field is formed from other color (that is, green and blue) pattern electrodes 13g, 13b changed over to H level of +400V to the developing roller 23.

Accordingly, the positively charged developing agent particles floating in the liquid developing agent in the nip 26 receive a repulsive force from the surface 14a of the high resistance layer 14 by the action of the electric field from the surface 14a of the high resistance layer 14 to the developing roller 23, and also receive a repulsive force from the pattern electrodes 13g, 13b by the action of the electric field from the green pattern electrode 13g and the blue pattern electrode 13b to the developing roller 23, and are attracted only to the red pattern electrode 13r by the action of the electric field from the developing roller 23 to the red pattern electrode 13r.

As a result, as shown in FIG. 7, the red developing agent particles are collected only in the recesses 14b having the red pattern electrode 13r in the bottom at a relatively high concentration, and a red pattern image 27 is formed therein. The shape of the pattern image 27 developed at this time is a shape depending on the shape of the recesses 14b of the high resistance layer 14, and therefore a plurality of arrayed rectangular patterns are formed at a thickness nearly equal to the high resistance layer 14. That is, rectangular pattern images 27 nearly in the same size as the rectangular portions 13a of the corresponding color pattern electrode 13r are arrayed and formed in a matrix.

After the red pattern image 27 is developed through the developing roller 23, the excess liquid developing agent D is removed from the surface of the wetted intaglio plate 1 through the nip 26. At this time, the potential of each pattern electrode 13 at the time of development is maintained without change, the squeeze roller 24 of the developing device 2r is rotated in the clockwise direction in the drawing, and a direct-current bias voltage of about +200V, for example, is applied to the squeeze roller 24. In this embodiment, the squeeze roller 24 is rotated in reverse direction so that its peripheral speed may be about 1 to 3 times of the moving speed of the developing device 2r.

The liquid developing agent D existing in the gap between the intaglio plate 1 and the squeeze roller 24 is lowered in the concentration of developing agent particles after passing the developing roller 23. On this diluted excess liquid developing agent, three electric fields are applied to act, that is, the electric field from the squeeze roller 24 to the red pattern electrode 13r, the electric field from the surface 14a of the high resistance layer 14 to the squeeze roller 24, and the electric field from the green and blue pattern electrodes 13g, 13b to the squeeze roller 24. As a result, a small portion of developing agent particles floating in the excess liquid developing agent is attracted only to the red pattern electrode 13r. The red developing agent particles already attracted to the pattern electrode 13r will not be peeled off because the electric field acts in a direction of pushing the particles to the pattern electrode 13r.

When the squeeze roller 24 rotates in reverse direction of the relative moving direction of the intaglio plate 1, a fluid action is applied to the excess liquid developing agent interposed between the intaglio plate 1 and the squeeze roller 24, and the excess liquid developing agent is rolled and collected in the casing 22 by way of the peripheral surface of the squeeze roller 24. At this time, the excess liquid developing agent particles forced in the direction away from the intaglio plate 1 by the action of the electric field explained above are collected into the casing 22 together with the excess insulating liquid by the rotation of the squeeze roller 24. That is, the surface of the intaglio plate 1 passing the squeeze roller 24 is only wetted slightly by the insulating liquid of the liquid developing agent in most cases.

The excess liquid developing agent adhered and collected on the peripheral surface of the squeeze roller 24 is moved again toward the intaglio plate 1, but is scraped off by the cleaning blade 25 pressed to the peripheral surface of the squeeze roller 24, and is collected in the casing 22. Thus, the excess liquid developing agent is collected in the casing 22, and is discharged into a collection tank (not shown) by a pump (not shown).

Then, as shown in FIG. 8, by the green developing device 2g, a second color (green) is developed on the intaglio plate 1. The developing operation of the second color is the same as in the development of the first color, and is executed in parallel to the charging operation and the developing operation of the first color. The basic operation is the same as the development of the red color, and thus only different points will be briefly described below.

In the opposite region of the developing device 2g of the intaglio plate 1, a grounding voltage (0V) of L level is applied to the green pattern electrode 13g adjacent to the red pattern electrode 13r, and a supply voltage (+200V) is applied to other color pattern electrodes 13r, 13b. A direct-current bias voltage of about +200V is applied to the developing roller 23 and the squeeze roller 24.

In this state, when the developing roller 23 is put in rotation, a nip 26 is formed in the portion of the developing roller 23 opposite to the intaglio plate 1. In this nip 26, an electric field from the developing roller 23 to the green pattern electrode 13 is formed, the developing agent particles floating in the green liquid developing agent are aggregated in the recesses 14b having the pattern electrode 13g, and a green pattern image 28 is formed therein. At this time, an electric field is formed from the surface 14a of the high resistance layer 14 to the developing roller 23, and an electric field is formed from other color patterns 13r, 13b not relating to the development to the developing roller 23, and the green developing agent particles are prevented from adhering to other portions of the intaglio plate 1.

However, when a strong electric field from the red pattern electrode 13r to the developing roller 23 is formed in the recesses 14b already having aggregated the red developing agent particles, if there is a possibility of the developing agent particles separating from the recesses 14b, the voltage to be applied to the red pattern electrode 13r may be set closer to the voltage applied to the developing roller 23.

Afterwards, a blue liquid developing agent is supplied to the intaglio plate 1 through the blue developing device 2b, and similarly blue developing agent particles are aggregated in the recesses 14b of the high resistance layer 14 having the blue pattern electrode 13b, and a blue pattern image 29 is formed therein. This developing operation of the blue developing device 2b is also executed in parallel to the other process including the charging operation as in the developing operations of the other colors.

Figure 9:
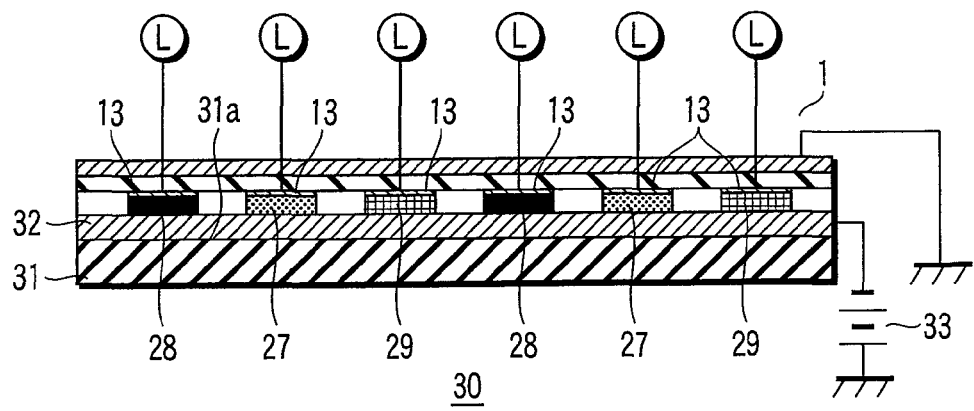
FIG. 9 is an operation explanatory diagram for explaining the transfer process for transferring a pattern image on a transfer object medium from the intaglio plate having finished the developing process.

When all colors are developed completely, as shown in FIG. 9, the intaglio plate 1 holding the color pattern images 27, 28, 29 and the insulating transfer object medium 31 are disposed closely opposite to each other, and all the pattern images 27, 28, 29 are collectively transferred on the transfer object medium 31. At this time, the intaglio plate 1 and the transfer object medium 31 are preferred to be opposite to each other through a tiny gap, and the insulating liquid of the liquid developing agents should be wet between the two.

The transfer object medium 31 has an opposite surface 31a facing the forming side of the pattern images 27, 28, 29 of the intaglio plate 1, and an electrode layer 32 is formed at the side of this opposite surface 31a. The transfer object medium 31 is an insulating board, which is made of, for example, glass material such as blue glass, quartz glass or low distortion point glass, or resin material such as polyimide, polyamide, acrylic, epoxy, urethane, polyester or phenol. In this embodiment, the transfer object medium 31 is a front board of a display panel, more specifically a rectangular glass plate having a thickness of about 0.5 mm to 3.0 mm.

The electrode layer 32 must be made of a conductive material having a surface resistance of $10^8$ Ω/□ or less at the point of transferring the pattern images 27, 28, 29 being opposite to the intaglio plate 1, and also must be made of a material which disappears when heated and evaporated, a material which disappears by sublimation when heated, or a material which becomes higher in resistance when heated and decomposed. Materials satisfying these two conditions include surfactant type antistatic agent, high polymer sustained antistatic agent, and conjugate type conductive polymer. That is, the electrode layer 32 of the embodiment is made of a material containing at least one of surfactant type antistatic agent, high polymer sustained antistatic agent, and conjugate type conductive polymer.

Examples of the surfactant type antistatic agent include N,N-(2-hydroxyethyl) alkylamine, N,N-(2-hydroxyethyl) alkylamide, aliphatic ester of polyoxy ethylene alkylamine, glycerin aliphatic ester, polyglycerin aliphatic ester, polyglycerin aliphatic ester aliphatic ester, polyoxy ethylene sorbitan aliphatic ester, sorbitan aliphatic ester, polyoxy ethylene aliphatic alcohol ester, alkyl sulfonate, alkyl benzene sulfonate, alkyl sulfate, alkyl phosphate, tetraalkyl ammonium salt, trialkyl benzyl ammonium salt, alkyl betaine, and imidazoline amphoteric surfactant. For example, the sorbitan aliphatic ester has a structure shown in formula (1), and tetraalkyl ammonium salt has a structure as shown in formula (2).

[Formula 1]

Sorbitan aliphatic ester (monoester)

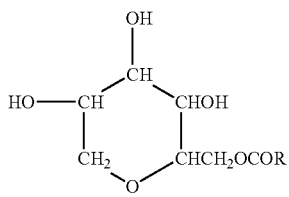

(1)

[Formula 2]

Tetraalkyl ammonium salt (lauryl trimethyl ammonium chloride)

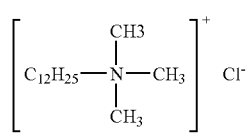

(2)

Examples of the high polymer sustained antistatic agent include polyethers such as polyethylene oxide, polyether esteramide, methoxy polyethylene glycol (meth)acrylate copolymer, polyether amideimide, and ethylene oxide-epihalohydrin copolymer, polymers containing quaternary ammonium base such as (meth)acrylate copolymer containing quaternary ammonium base, methacrylimide copolymer containing quaternary ammonium base, and maleimide copolymer containing quaternary ammonium base, sodium polystyrene sulfonate, carbobetaine graft copolymer, and high molecular charge moving type bond.

For example, the (meth)acrylate copolymer containing quaternary ammonium base has a structure as shown in formula (3).

[Formula 3]

(Meth)acrylate copolymer containing quaternary ammonium base

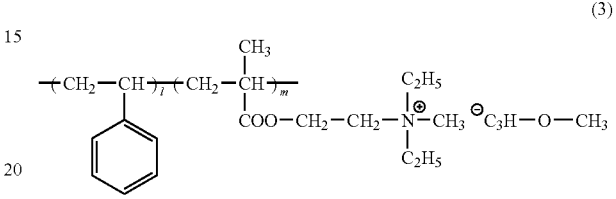

(3)

Examples of the conjugate type conductive polymer include polyacetylene, poly(paraphenylene), polypyrrole, polythiophene, polyaniline, polyphenylene sulfide, poly(phenylene ethynylene), poly(phenylene vinylene), and polyacene.

To heighten the conductivity of these high polymers and realize stable properties, it is generally known to dope these conductive high polymers with dopants. When an appropriate dopant is added to these high polymers, they are partly oxidized or reduced, and come to have p-type or n-type semiconductor characteristics.

Examples of the dopant include halogens such as $I_2$, $Br_2$, $Cl_2$, ICl, $ICl_3$, IBr, and IF, Lewis acids such as $BF_3$, $PF_5$, $AsF_5$, $SbF_6$, $SO_3$, $BBr_5$, $BF_4^-$, $PF_6^-$, $AsF_6^-$, $SbF_6^-$, and $ClO_4^-$, protonic acids such as sulfuric acid, nitric acid, hydrochloric acid, perchloric acid, hydrofluoric acid, $FSO_3H$, and $CFSO_3H$, transition metal halides such as $FeCl_3$, $MoCl_5$, $WCl_5$, $SnCl_4$, $MoF_5$, FeOCl, $RuF_5$, $TaBr_5$, $SnI_4$, and $LnCl_3$ (Ln=lanthanoid metal), organic compounds such as TCNQ, DDQ, and TCNE, alkali metals such as Li, Na, K, Cs, and Rb, ammonium ions such as $NEt_{4+}$ and $N''Bu_{4+}$, lanthanoid metals such as Eu, and high polymer dopants such as porphyrins, various pigments, alkyl sulfonate, alkyl benzene sulfonate, and PSS.

It is also possible to use a self-dopant type conductive high polymer expressing conductivity by applying an electrical bias in the conductive high polymer.

For example, polyaniline has a structure as shown in formula (4).

[Formula 4]

Polyaniline

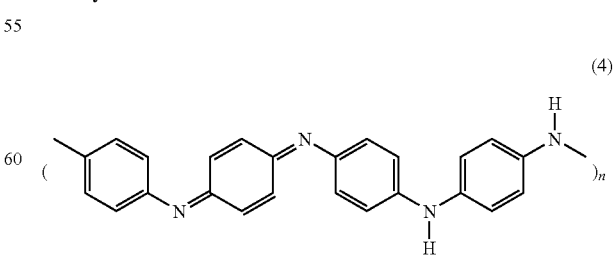

(4)

For example, polythiophene has a structure as shown in formula (5).

[Formula 5]

PEDOT/PSS

Poly(3,4-ethylenedioxythiophene)/poly(styrenesulfonate)

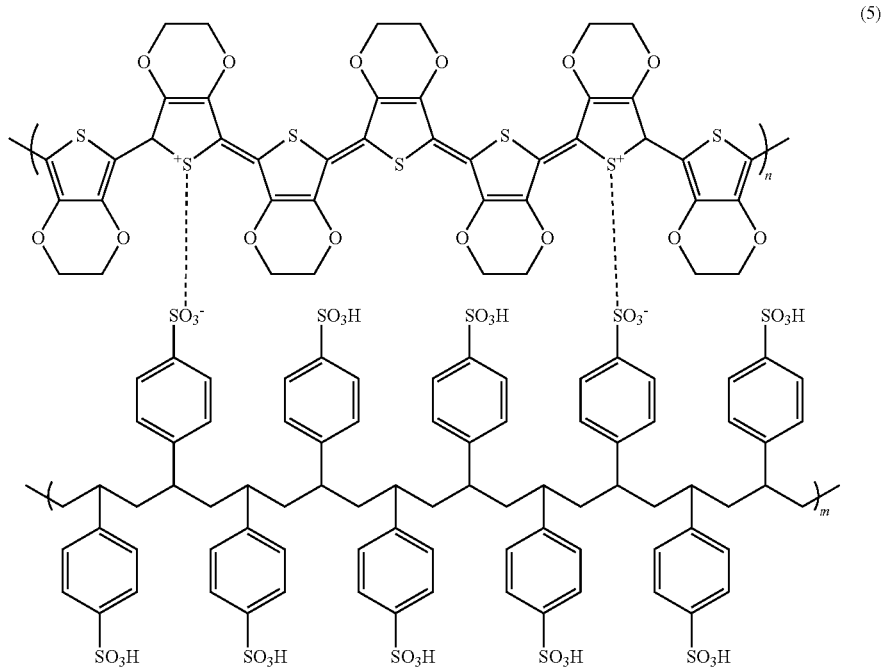

(5)

For example, polypyrrole has a structure as shown in formula (6).

[Formula 6]

Soluble polypyrrole and dopant (TCNA)

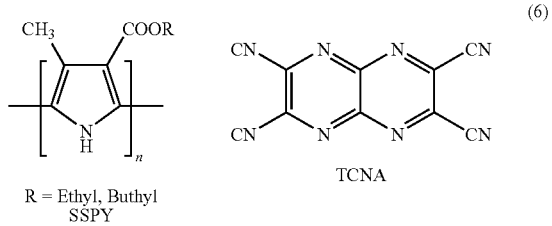

(6)

R = Ethyl, Buthyl
SSPY

TCNA

For example, polysulfonic thiophene as self-doping type conductive high polymer has a structure as shown in formula (7).

[Formula 7]

Polysulfonic thiophene

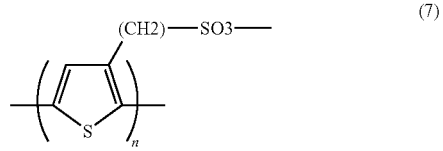

(7)

When transferring the pattern images 27, 28, 29 held on the intaglio plate 1 on the transfer object medium 31 provided with the electrode layer 32 having such functions, first, as shown in FIG. 9, the closely and oppositely disposed intaglio plate 1 and transfer object medium 31 are positioned properly. At this time, in this embodiment, since positioning is not needed among the color pattern images 27, 28, 29, positioning at high precision is possible. In other words, since the color pattern images 27, 28, 29 are formed in a shape nearly depending on the shape of the recesses 14b of the high resistance layer 14 of the intaglio plate 1, in this embodiment, positioning among the respective colors is not needed.

The transfer device 30 for transferring the pattern images 27, 28, 29 of the intaglio plate 1 on the transfer object medium 31 has, in addition to the electrode layer 32, a power source device 33 for applying a specific voltage to this electrode layer 32.

Figure 10:
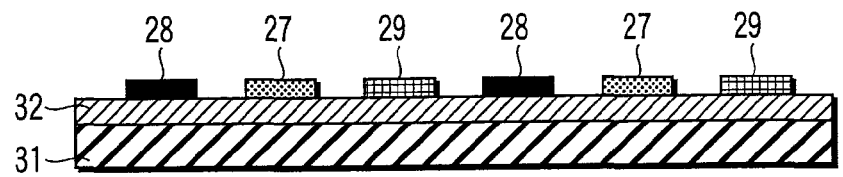
FIG. 10 is a diagram showing a state of transferring a pattern image on the transfer object medium by the transfer process in FIG. 9.

When transferring the color pattern images 27, 28, 29, as shown in FIG. 9, in the transfer device 30, the intaglio plate 1 and the transfer object medium 31 are placed opposite to each other, and a voltage of L level (0V) is applied to all the pattern electrodes 13 of the intaglio plate 1, and a bias voltage of about −200V, for example, is applied to the counter electrode 32 from the power source device 33. As a result, a relatively strong transfer electric field is formed from all the pattern electrodes 13 to the counter electrode 32, and, as shown in FIG. 10, all the pattern images 27, 28, 29 held on the intaglio plate 1 are collectively transferred to the surface of the transfer object medium 31.

Figure 11:
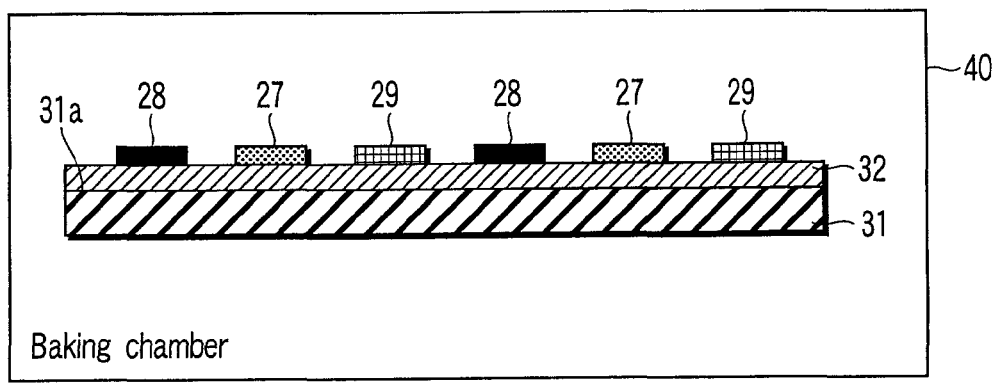
FIG. 11 is a schematic diagram showing a state of loading the transfer object medium, on which the pattern image has been transferred, into a baking chamber.

Afterwards, the transfer object medium 31 on which the pattern images 27, 28, 29 have been transferred is placed in a baking chamber 40 as shown in FIG. 11, and the electrode layer 32 at the opposite side 31a of the transfer object medium 31 is heated, and decomposed, evaporated or sublimated to be high in resistance. Herein, by being "decomposed," it means that the organic components are vaporized to be inorganic, leaving very small traces of residue, when the conductive organic components of the electrode layer 32 exceeds the intrinsic temperature of pyrolysis of the substance by heating.

To be high in resistance means that the conductive organic components of the electrode layer 32 are heated, and decomposed, evaporated or sublimated, thereby losing weight (disappearing) to the extent that the conductivity may not be maintained, or causing structural changes, and the resistance value of the electrode layer 32 in this case is about $10^{10}$ Ω/□ or more.

For example, when the electrode layer 32 is formed by using a conductive agent mainly composed of sorbitan laurate of the surfactant type antistatic agent, by heating the electrode layer 32 at high temperature of about 300° C. for about 60 minutes, the sorbitan laurate is evaporated and lost, and the electrode layer 32 becomes high in resistance.

Alternatively, when the electrode layer 32 is formed by using a conductive agent mainly composed of polyaniline of the conjugate type conductive polymer, by heating the electrode layer 32 at high temperature of about 500° C. for about 60 minutes, the polyaniline is decomposed, and the conductivity of the electrode layer 32 becomes high in resistance.

When the electrode layer 32 is formed by using a conductive agent mainly composed of (meth)acrylate copolymer containing quaternary ammonium base of the high polymer sustained antistatic agent, by heating the electrode layer 32 at high temperature of about 450° C. for about 60 minutes, the (meth)acrylate copolymer containing quaternary ammonium base is decomposed, and the conductivity of the electrode layer 32 becomes high in resistance.

When the electrode layer 32 is formed by using a conductive agent mainly composed of PEDOT/PSS (polyethylene dioxy thiophene) of the conjugate type conductive polymer, by heating the electrode layer 32 at high temperature of about 520° C. for about 60 minutes, the PEDOT/PSS (polyethylene dioxy thiophene) is decomposed, and the conductivity of the electrode layer 32 becomes high in resistance.

When the electrode layer 32 is formed by using a conductive agent mainly composed of the conjugate type conductive polymer, by heating the electrode layer 32 at high temperature of about 500° C. for about 60 minutes, the polyaniline is decomposed, and the conductivity of the electrode layer 32 becomes high in resistance.

When the electrode layer 32 is formed by using a conductive agent mainly composed of sodium dodecyl benzene sulfonate of the surfactant type antistatic agent, by heating the electrode layer 32 at high temperature of about 600° C. for about 60 minutes, the sodium dodecyl benzene sulfonate is decomposed, and the electrode layer 32 becomes high in resistance.

That is, by employing the pattern forming method of the embodiment, after the pattern images 27, 28, 29 are once collectively transferred to the side of the transfer object medium 31 from the intaglio plate 1 by making use of the electrode layer 32 preliminarily formed on the opposite side 31a of the transfer object medium 31, the unnecessary electrode layer 32 is eliminated or heightened in resistance, whereby a structure having the pattern images 27, 28, 29 on the opposite side 31a of the transfer object medium 31 can be obtained. For example, in the embodiment, by employing this method, a structure having three-color phosphor layers in the inside of the glass board can be formed.

In particular, according to the embodiment, since the transfer object medium 31 forms a transfer electric field between the electrode layer 32 provided at the opposite side 31a facing the intaglio plate 1 and the pattern electrode 13 of the intaglio plate 1, as compared with the case of disposing the electrode at the reverse side remote from the intaglio plate 1 of the transfer object medium 31, the transfer electric field can be intensified without raising the voltage, and a stable transfer is realized. Besides, the electrode layer 32 after use can be eliminated or heightened in resistance as mentioned above, and is not left over on the transfer object medium 31 to cause problems.

In the embodiment, by controlling the voltage applied to the plurality of pattern electrodes 13 formed in the intaglio plate 1, the developing and transfer processes can be executed, and thus the transfer operation by using the corona charger, for example, is not required plural times, and a stable transfer is realized.

According to the embodiment, a manufacturing device suited to manufacture of a display panel of a flat panel type display device of relatively large size can be provided.

Also in the embodiment, patterns 27, 28, 29 of thickness depending on the thickness of the high resistance layer 14 of the intaglio plate 1 can be formed, and it is suited to forming of a relatively thick pattern.

The above function of the electrode layer 32 will be more specifically described below by referring to some examples.

EXAMPLE 1

As shown in FIG. 13, a high distortion point glass plate 31 having thickness of 2.8 mm was prepared as an insulating transfer object medium, a surface 31a of this glass plate 31 was directly coated with Denatron G-115S (trademark) of Nagase Chemtex Corporation by using a bar coater, and dried, and an electrode layer 32 having a film thickness of 0.2 μm was formed. The resistance value of this electrode layer 32 was measured by using a surface resistance meter of Siltechs (SLT-YKH4101), and the resistance value was $6.3 \times 10^5$ Ω/□.

A phosphor toner layer of particle size of 4 microns was formed on the surface of the electrode layer 32 of this structure as fine particle layer for test, and was put into a baking chamber 40, and baked for 1 hour at temperature of about 500° C., and the resistance value of the structure surface was measured. However, it was impossible to measure because it exceeded the measuring range of the resistance value. It is estimated that the resistance value at this time was $2 \times 10^9$ Ω/□ or more, and it is suggested that the electrode layer 32 was eliminated.

EXAMPLE 2

As shown in FIG. 14, a high distortion point glass plate 31 having thickness of 2.8 mm was prepared as an insulating transfer object medium, a solid film of a black matrix layer 42 of about 5 μm was formed on the surface 31a of the glass plate 31, and Denatron G-115S (trademark) of Nagase Chemtex Corporation was applied on the layer 42 by using a bar coater and dried, and an electrode layer 32 having a film thickness of 0.18 μm was formed. Also in this case, the resistance value of this electrode layer 32 was measured by using a surface resistance meter of Siltechs (SLT-YKH4101), and the resistance value was $4.2 \times 10^4$ Ω/□.

A phosphor toner layer of particle size of 4 microns was formed on the surface of the electrode layer 32 of this structure as fine particle layer for test, and was put into a baking chamber 40, and baked for 1 hour at temperature of about 500° C., and the resistance value of the structure surface was measured. However, it was impossible to measure because it exceeded the measuring range of the resistance value. It is estimated that the resistance value at this time was $2 \times 10^9$ Ω/□ or more, and it is suggested that the electrode layer 32 was eliminated.

EXAMPLE 3

Figure 15:
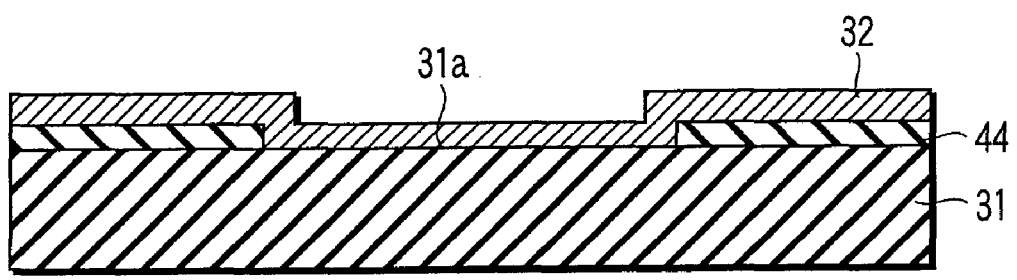
FIG. 15 is a diagram for explaining Example 3.

As shown in FIG. 15, a high distortion point glass plate 31 having thickness of 2.8 mm was prepared as an insulating transfer object medium, a solid film of a black matrix layer of about 5 μm was formed on the surface 31a of the glass plate 31, this solid film was patterned by photo etching to form a pattern 44 of black matrix, and Denatron G-115S (trademark) of Nagase Chemtex Corporation was applied on the layer 44 by using a bar coater and dried, and an electrode layer 32 having a film thickness of 0.19 μm was formed. Also in this case, the resistance value of this electrode layer 32 was measured by using a surface resistance meter of Siltechs (SLT-YKH4101), and the resistance value was $8.8 \times 10^4$ Ω/□.

A phosphor toner layer of particle size of 4 microns was formed on the surface of the electrode layer 32 of this structure as fine particle layer for test, and was put into a baking chamber 40, and baked for 1 hour at temperature of about 500° C., and the resistance value of the structure surface was measured. However, it was impossible to measure because it exceeded the measuring range of the resistance value. It is estimated that the resistance value at this time was $2 \times 10^9$ Ω/□ or more, and it is suggested that the electrode layer 32 was eliminated.

When manufacturing a front panel of a display device such as liquid crystal display (LCD), plasma display (PDP), field emission display (FED), or surface conduction type electron-emitter display (SED), as the structure to be formed on the surface 31a of the glass plate 31, aside from the black matrix pattern 44 described above, resistance forming material, filter material, or phosphor material may be used. That is, it is known that the electrode layer 32 can be eliminated by being heated, whether it is formed directly on the surface 31a of the glass plate 31 before forming the structure as in Example 1, or it is formed after forming the structure as in Example 2 or Example 3.

Figure 16:
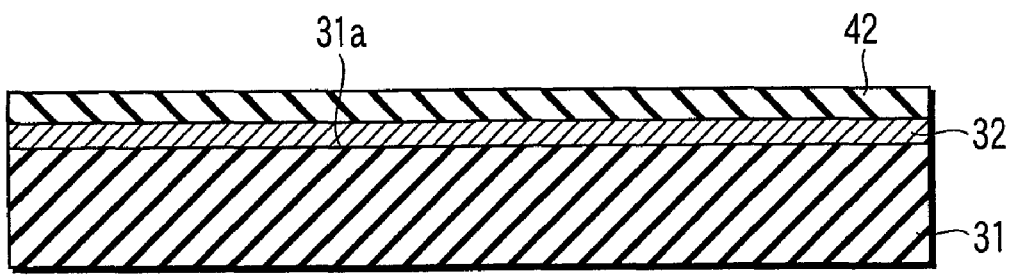
FIG. 16 is a diagram for explaining Example 4.
Figure 17:
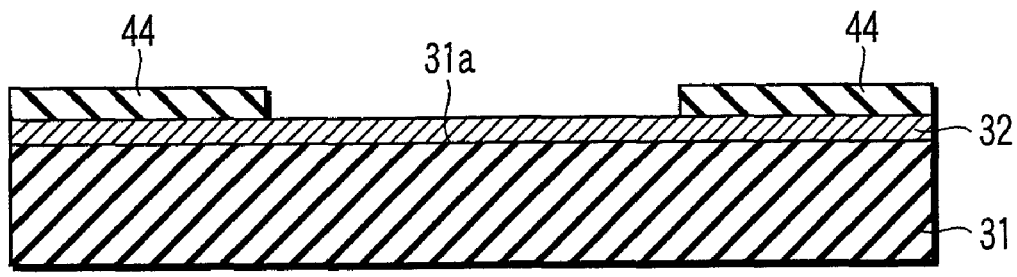
FIG. 17 is a diagram for explaining Example 5.

Besides, Example 4 is shown in FIG. 16, in which an electrode layer 32 is formed on the surface 31a of the glass plate 31, and a black matrix layer 42 is formed thereon to form a fine particle layer, and then the electrode layer 32 is baked and eliminated. In Example 5 shown in FIG. 17, an electrode layer 32 is formed on the surface 31a of the glass plate 31, and a black matrix layer is formed thereon and patterned, a fine particle layer is formed after patterning 44, and then the electrode layer 32 is baked and eliminated.

Figure 18:
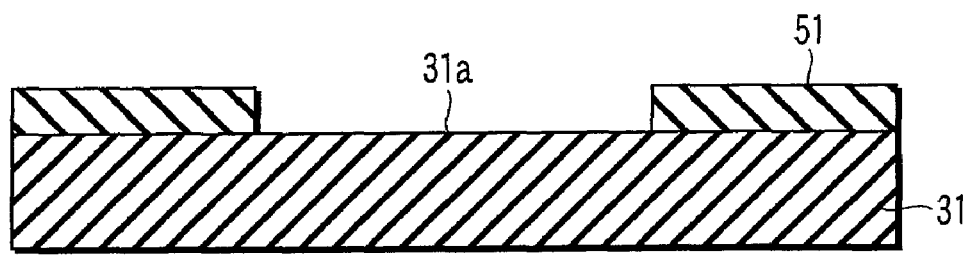
FIG. 18 is a diagram for explaining a pattern forming method according to another embodiment.
Figure 19:
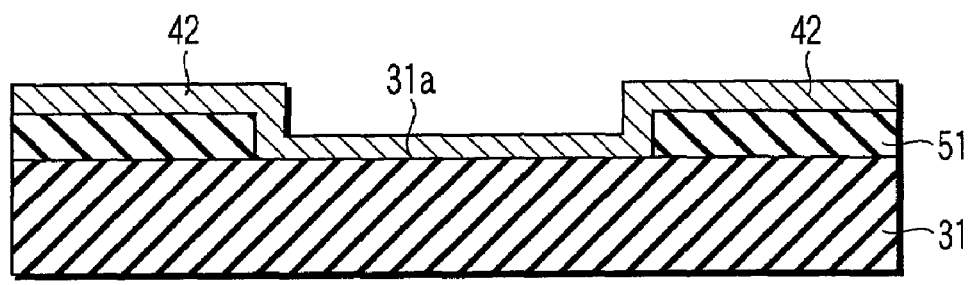
FIG. 19 is a diagram for explaining a pattern forming method according to another embodiment.
Figure 20:
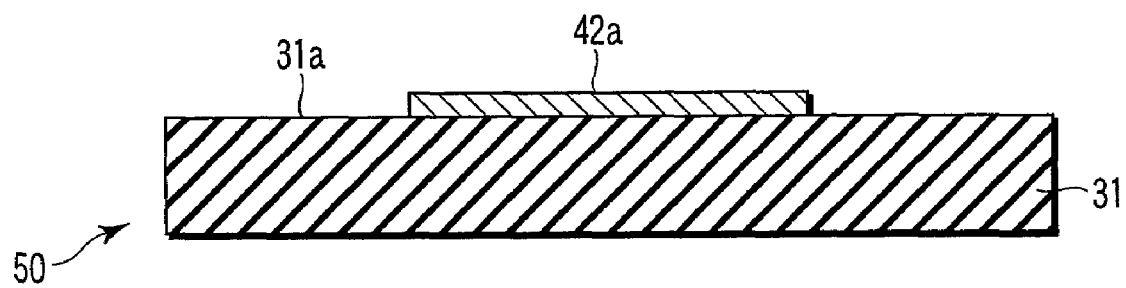
FIG. 20 is a diagram for explaining a pattern forming method according to another embodiment.

Referring next to FIGS. 18 to 20, a pattern forming method in another embodiment will be explained. This pattern forming method is the same as the pattern forming method using the intaglio plate 1 mentioned above in that the patterns 27, 28, 29 are once transferred to the transfer object medium 31 and then the electrode layer 32 is eliminated or heightened in resistance, but different in that the patterns are formed directly on the transfer object medium without using the intaglio plate 1.

In this method, first as shown in FIG. 18, a resist layer 51 is formed for forming a pattern on the surface 31a of the glass plate 31 as the transfer object medium. Then, as shown in FIG. 19, the electrode layer 32 is overlapped and formed on this resist layer 51. Further, as shown in FIG. 20, this electrode layer 32 is lifted off at the position of the resist layer, and a patterned electrode layer 42a is formed.

Afterwards, through a supply member (not shown), a liquid developing agent is supplied from the surface side of the structure 50 in FIG. 20, and an electric field is formed between the supply member and the electrode layer 42a. As a result, the charged developing agent particles in the liquid developing agent float in an insulating liquid, and are attracted to the electrode layer 42a, whereby a pattern image depending on the shape of the electrode layer 42a is formed.

Further, in the baking chamber 40, for example, as explained in FIG. 11, the glass plate 31 after development having this pattern image is placed, and heated, and the electrode layer 42a is eliminated or heightened in resistance, and a desired object is obtained.

Thus, also in this embodiment, the same effects as those in the foregoing embodiment can be obtained, and without using the intaglio plate 1, a fine pattern can be formed on an insulating board. As a result, the structure is further simplified, and the manufacturing cost of a panel can be lowered.

The invention is not limited to these embodiments alone, and may be changed and modified within a scope not departing from the true spirit thereof. Various modifications are possible by properly combining the plural component elements of the embodiments. For example, certain component elements may be omitted from all component elements of the embodiments, or component elements of different embodiments may be properly combined.

For example, in the embodiments, the electrode layer 32 formed directly or indirectly at the opposite side 31 of the transfer object medium 31 is heated and eliminated or heightened in resistance, but not limited to this process, the electrode layer 32 may be formed of a material which is eliminated or heightened in resistance when exposed to light.

In the embodiments, the developing agent particles are positively charged, and the pattern forming device is operated, but all the components may be charged in reverse polarity.

In the embodiments, the invention is applied to the device for forming a phosphor layer or a color filter on the front board of a flat panel image display device, but the invention may be applied widely as a manufacturing apparatus in various technical fields.

For example, when the composition of the liquid developing agent is modified, the invention may be applied to an apparatus for forming conductive patterns in circuit board or IC tag. In this case, the liquid developing agent is composed of, for example, resin particles having average particle size of 0.3 μm, metal fine particles (for example, copper, palladium, silver) having average particle size of 0.02 μm adhered to the surface of the resin particles, and a charge regulating agent such as metal soap. Then, by the same method as in the embodiment, a wiring pattern can be formed, for example, on a silicon wafer by the developing agent. Generally, however, it is not easy to form a circuit pattern having sufficient conductivity by the developing agent only, and thus it is preferred to plate mainly with such metal fine particles after forming the pattern. Thus, the conductive circuit, capacitor, or resistor can be patterned.

In the foregoing embodiments, by forming the relatively thick high resistance layer 14 for partially covering the pattern electrode 13 of the intaglio plate 1, a relatively thick pattern is formed by the depth of the recesses 14b, but not limited to this example, the recesses 14b are not essential for the configuration of the invention.

Further in the foregoing embodiments, the electrode layer 32 is heated, and is decomposed and heightened in resistance, or heated and evaporated or sublimated, but the electrode layer 32 may be eliminated by using a plasma processing device.

By using a plasma processing device, in a vacuum tank evacuated to about $10^{-4}$ Pa, a mixed gas of oxygen and fluorine gas is introduced to generate plasma, and the electrode layer 32 is eliminated by plasma for 20 seconds. In the plasma processing, a mixed gas of oxygen and fluorine gas is used, but depending on the type of resin to be removed, single gas such as fluorine gas, oxygen, argon gas, or chlorine gas may be used, and a mixed gas by combing these gases properly may be used, and the same plasma processing effects will be obtained.

According to the pattern forming method of the invention, the developing agent can be transferred efficiently on an insulating board (transfer object medium), and the transfer performance may be enhanced.

What is claimed is:

1. A pattern forming method comprising:
    a developing step of forming a pattern image by a charged developing agent on an image carrier;
    a transfer step of disposing a transfer object medium having an electrode layer on the opposite side facing the image carrier oppositely to the image carrier, forming an electric field between the image carrier and the electrode layer, and transferring the pattern image on the transfer object medium; and
    an eliminating step of eliminating the electrode layer.

2. The pattern forming method according to claim 1, wherein the eliminating step is evaporating the electrode layer by heating.

3. The pattern forming method according to claim 1, wherein the eliminating step is sublimating the electrode layer by heating.

4. The pattern forming method according to claim 1, 2 or 3, wherein the electrode layer is formed of a material containing at least one of surfactant type antistatic agent, high polymer sustained antistatic agent and conjugate type conductive polymer.

* * * * *